United States Patent
Flinsenberg et al.

(10) Patent No.: US 10,922,289 B2
(45) Date of Patent: Feb. 16, 2021

(54) DEVICE FOR AND METHOD OF DETERMINING A LENGTH OF A RELEVANT HISTORY

(71) Applicant: KONINKLIJKE PHILIPS N.V., Eindhoven (NL)

(72) Inventors: Ingrid Christina Maria Flinsenberg, Eindhoven (NL); Marc Aoun, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 340 days.

(21) Appl. No.: 16/063,908

(22) PCT Filed: Dec. 15, 2016

(86) PCT No.: PCT/EP2016/081099
§ 371 (c)(1),
(2) Date: Jun. 19, 2018

(87) PCT Pub. No.: WO2017/108550
PCT Pub. Date: Jun. 29, 2017

(65) Prior Publication Data
US 2019/0026323 A1    Jan. 24, 2019

(30) Foreign Application Priority Data
Dec. 24, 2015 (EP) ...................................... 15202662

(51) Int. Cl.
*G06F 16/215* (2019.01)
*H03M 7/30* (2006.01)
(Continued)

(52) U.S. Cl.
CPC ............ *G06F 16/215* (2019.01); *G06F 17/18* (2013.01); *G06N 7/00* (2013.01); *H03M 7/30* (2013.01); *H03M 7/707* (2013.01); *G06K 9/6256* (2013.01)

(58) Field of Classification Search
CPC ......... G06F 16/215; G06F 17/18; G06N 7/00; G06K 9/6256; H03M 7/30; H03M 7/707
See application file for complete search history.

(56) References Cited

U.S. PATENT DOCUMENTS

| | | | | |
|---|---|---|---|---|
| 5,298,896 A | * | 3/1994 | Lei ...................... | H03M 7/4006 341/107 |
| 8,046,370 B2 | * | 10/2011 | Wen ...................... | G06F 16/338 707/748 |

(Continued)

FOREIGN PATENT DOCUMENTS

WO    2015053773 A1    4/2015

OTHER PUBLICATIONS

Begleiter et al: "On Prediction Using Variable Order Markov Models"; Journal of Artificial Intelligence Research 22 (2004), pp. 385-421.

(Continued)

*Primary Examiner* — Matthew J Ellis (57) ABSTRACT

A device (100) for and a method of determining a length of a history of instances of a first type of data are provided. The device comprises a second data set unit (104), a first data set unit (102), a first conditional entropy unit (106), a threshold unit (108), and a length determining unit (114). The first data set unit, the second data set unit and the threshold unit obtain input data. The first conditional entropy unit determines a first conditional entropy for a second data set given a first data set. The determining unit searches for a length of the relevant history by determining a smallest length for sequences of a reduced first set of data for which a second (Continued)

conditional entropy for the second set of data, given the reduced first set of data, is within a maximum entropy increase threshold from the first conditional entropy.

12 Claims, 4 Drawing Sheets

(51) Int. Cl.
*G06N 7/00* (2006.01)
*G06F 17/18* (2006.01)
*G06K 9/62* (2006.01)

(56) References Cited

U.S. PATENT DOCUMENTS

| | | | | |
|---|---|---|---|---|
| 8,786,473 | B2* | 7/2014 | Samuels | H03M 7/3084 341/87 |
| 2002/0107853 | A1* | 8/2002 | Hofmann | G06F 16/335 |
| 2014/0351183 | A1* | 11/2014 | Germain | G06N 20/00 706/12 |
| 2015/0040149 | A1* | 2/2015 | Frank | G07C 13/00 725/10 |
| 2016/0247175 | A1* | 8/2016 | Milton | G06Q 30/0205 |
| 2016/0360336 | A1* | 12/2016 | Gross | H04M 1/72583 |

OTHER PUBLICATIONS

Cagnazzo et al: "Mutual Information-Based Context Quantization"; Signal Processing: Image Communication 25 (2010), pp. 64-74.

Cardinal: "Quantization With an Information—Theoretic Distortion Measure"; Oct. 2002, Published by the University Libre de Bruxelles, 10 Page Document.

Wang et al: "An Attribute Reduction Algorithm in Rough Set Theory Based on Information Entropy"; 2008 International Symposium on Computational Intelligence and Design, IEEE, 2008, pp. 3-6.

Willems et al: "The Context-Tree Weighting Method: Basic Properties"; IEEE Transactions on Information Theory, vol. 41, No. 3, May 1995, pp. 653-664.

Willems et al: Reflections on "The Context-Tree Method: Basic Properties"; IEEE Information Theory Information Theory Society Newsletter, vol. 47, No. 1, Mar. 1997,.

Tjalkens et al: "Context Tree Weighting: Multi-Alphabet Sources:" Proceedings of the Fourteenth Symposium on Information Theory in the Benelux, May 1993. pp. 128-135.

Tjalkens et al: "Sequential Weighting Algorithms for Multi-Alphabet Sources"; Presented at the Sixt Joint Swedish-Russian Workshop on Information Theory, Nov. 25, 2004, pp. 1-7.

* cited by examiner

Fig. 4

DEVICE FOR AND METHOD OF DETERMINING A LENGTH OF A RELEVANT HISTORY

FIELD OF THE INVENTION

The invention relates to devices for determining a length of a relevant history of instances of a first type of data.

The invention further relates to methods of determining a length of a relevant history of instances of a first type of data.

The invention also relates to methods of reducing a dataset, methods of predicting an instance of a second type of data based on a history of instances of a first type of data, and computer program products for determining a length of a relevant history of instances of a first type of data.

BACKGROUND OF THE INVENTION

In machine learning technologies historical data is often used to train the machine, to enable the machine to predict an event based on a recent set of data. In many cases, a very long data history is used to train the machine as well as possible. However, it may require quite a lot of data storage and processing power to use such a long history. Also when new data arrives on which the training must be based, all historical data, including the new data, must be processed once again. Also some other predictive technologies directly use a data history of determined events and measured values. Then, often, the whole stored data history available is used and when a prediction has to be made on the basis of a recent set of data, the whole data history is processed to find similarities between the recent data with the data history— this requires quite a lot of processing power. There is a need to reduce the amount of historical data to be stored.

Often experts are consulted to get their opinion about the relation between the data to be predicted and the measured (sensor) data. It may be that the data that is being used to predict an event is data obtained from a plurality of sensors. In the traditional approach one determines a single history length for the data of all the different sensors. However, it may be that the length of the history of specific sensors may be reduced more because only relative short histories of these specific sensors comprise most information with respect to the event that is going to be predicted. Consequently, the traditional approach of reducing the length of the history to be used in the predictive technologies does either result in storing too much data or results in inaccurate predictions because too much data is thrown away.

Above it has been mentioned that the predictive technology is suitable for predicting "an event". It has to be noted that the term "event" must be read broadly. "Event" may represent a characteristic of a physical entity, for example, "a component of a machine is going to break down or not", or "the energy consumption of the factory is going to be too high or not". These examples relate to a binary prediction: "something is true or not". However, the above discussed predictive technologies are not limited to binary characteristics and may predict the characteristics also for characteristics that have a value in a higher base numeral system, for example, "the energy consumption of this city is going to be low, medium, or high". The above discussed predictive technologies may also apply to regression use cases in which a scalar value is obtained based on historical data. This interpretation also applies to the remaining of this document.

SUMMARY OF THE INVENTION

It is an object of the invention to provide a system and a method capable of determining a length of a relevant history of instances of a first type of data that must be kept or used when an instance of second type of data has to be predicted on the basis of (more recent) instances of the first type of data. The term relevant means in this context: a reliable prediction of the instance of the second type of data is possible on the basis of (more recent) instances of the first type of data and on the basis of historical data that comprises sequences of a limited length with historical information about instances of data of the first type.

For this purpose, according to an aspect of the invention, a device for determining a length of a relevant history of instances of a first type of data is provided.

For this purpose, according to another aspect of the invention, a method of determining a length of a relevant history of instances of a first type of data is provided.

For this purpose, according to further aspects of the invention, a method of reducing a dataset, a method of predicting an instance of a second type of data based on a history of instances of a first type of data and a computer program product are provided.

The provided device is arranged for determining a length of a history of instances of a first type of data for reducing a data set comprising instances of the first type of data. The instances of the first type of data comprise information for predicting at least one instance of the second type of data. The device comprises a second data set unit, a first data set unit, a first conditional entropy unit, a threshold unit, a length determining unit and an output unit. The second data set unit obtains a second set of data comprising instances of the second type of data. Instances of the second type of data comprise data based on characteristic of a physical entity. The first data set unit obtains a first set of data comprising sequences of instances of the first type of data. Each sequence provides a history of instances of the first type of data for a corresponding element of the second set. Each sequence comprises instances preceding the moment in time at which the corresponding element of the second set is determined. The instances of the first type of data are ordered according to time in the sequences. Instances of the first type of data comprise data based on measured sensor data. The first conditional entropy unit obtains a first conditional entropy for the second set of data given the first set of data. The threshold unit obtains a maximum entropy increase threshold indicating a factor by which the first conditional entropy may increase when the length of the sequences in the first set of data is reduced. The length determining unit determines the length of the relevant history by determining a smallest length for the sequences of a reduced first set of data for which a second conditional entropy for the second set of data given the reduced first set of data is within the maximum entropy increase threshold from the first conditional entropy. The reduced first set of data comprises sequences of the smallest length and the sequences of the reduced set of data comprise the most recent instances of the first type of data of their corresponding sequences in the first set of data. The output unit provides the smallest length for the sequences as the length of the relevant history to, for example, a data reduction arrangement for reducing the amount of history stored for the data of the first type.

The provided method, which may be a computer-implemented method, determines a length of a history of instances of a first type of data for reducing a data set comprising instances of the first type of data. The instances of the first type of data comprising information for predicting instance of a second type of data. The method comprises i) obtaining a second set of data comprising instances of the second type of data, instances of the second type of data comprising data being based on a characteristic of a physical entity, ii) obtaining a first set of data comprising sequences of instances of the first type of data, each sequence providing a history of instances of the first type of data for a corresponding element of the second set, each sequence comprising instances preceding the moment in time at which the corresponding element of the second set is determined, the instances of the first type of data being ordered according to time in the sequences, instances of the first type of data comprising data being based on measured sensor data, iii) obtaining a first conditional entropy for the second set of data given the first set of data, iv) obtaining a maximum entropy increase threshold indicating a factor by which the first conditional entropy may increase when the length of the sequences in the first set of data is reduced, v) determining the length of the relevant history by determining a smallest length for the sequences of a reduced first set of data for which a second conditional entropy for the second set of data given the reduced first set of data is within the maximum entropy increase threshold from the first conditional entropy, the reduced first set of data comprises sequences of the smallest length and the sequences of the reduced set of data comprise the most recent instances of the first type of data of their corresponding sequences in the first set of data, vi) providing the smallest length for the sequences as the length of the relevant history to, for example, a data reduction arrangement for reducing the amount of history stored for the first type of data.

An effect of the features and the measures of the device and the method is that one obtains a number for the length of the sequences of instances of the first type of data that must be kept to maintain enough historic information in the first set of data to reliably predict instances of the second type of data.

The conditional entropies are a measure that defines the remaining uncertainty of (current and future) instances of the second data type given the knowledge of a set of data that comprises sequences of (historic) instances of the first type of data. If the conditional entropy is relatively low, the set of data that comprises sequences of (historic) instances of the first type of data comprises a lot of information about (current and future) instances of the second type of data and is, therefore, useful for predicting instances of the second type of data when a (more recent) sequence of instances of the first type of data is known.

In the field of information theory it is known and proven that a conditional entropy for, for example, a variable y given a sequence of instances $x_1 \ldots x_n$ increases or remains equal if one of the instances of the sequence $x_1 \ldots x_n$ is removed. In the context of the above described device and method, the sequence $x_1 \ldots x_n$ can be seen as a history of instances of the first type of data. Thus, if one desires to reduce the amount of historical data to be kept, one has to accept that the conditional entropy may increase and that the uncertainty about variable y given less historical data may increase. With the above described device or by applying the above described method one finds until which length the sequences with instances of the first type of data may be reduced such that the conditional entropy does not increase too much. Thus, the requirement of data reduction is balanced against the increase in uncertainty. How much the conditional entropy may increase has been defined by the maximum entropy increase factor and, thus, the maximum entropy increase factor determines the balance between data reduction and the increase in uncertainty. If one does not want to accept a large increase in uncertainty, a low maximum entropy increase threshold factor must be used. If one wants more data reduction, a higher maximum entropy increase threshold factor must be used. Given the defined maximum entropy increase threshold, the device or the method finds to which number the lengths of the instances the sequences with (historic) instances of the first data type may be reduced.

Instances of data of the first type are being based on measured sensor data. This means that the data of the first type may be measurements of a specific sensor, but may also be a specific combination of measured values by two specific sensors that are combined, "fused", into a single value. For example, several temperature measurements sensed by sensors that sense a temperature of a specific physical entity may be averaged into a single temperature value representing the temperature of the specific physical entity.

It is to be noted that the determined length of the relevant history relates to one specific combination of a first type of data and of a second type of data. For example, the first type of data is data obtained from one specific type of sensor that has a specific function in an apparatus. The first type of data does not relate to other sensors of the apparatus or the same type of sensor but with a different function in the apparatus. It may also be that the first type of data may be from sensors of the specific type having the specific function in different apparatuses of the same type. For example, the first type of data may be the temperature of a specific motor in the apparatus. In the example, the apparatus may have more temperature sensors that measure the temperature of other components, but the measured values of these other sensors are of a different type of data. This also applies to situation when values of different sensors are combined into one specific value: then instances of the first type of data always relate to the same combination of the same type of sensors that have the same functions. The same applies to the second type of data: it is a specific characteristic of a specific type of a physical entity. For example, whether a component of an apparatus fails or not. In the example, the failure status of other components is another type of data. One instance of the second set corresponds to a sequence in the first set—this means that at the moment in time that an instance of the second set was determined at a specific machine, the specific sensor of the specific machine measured during an interval of time preceding the moment in time the instances of the corresponding sequence. It might also be that the sequence comprises an instance of the sensor obtained at the moment in time that the specific (corresponding) instance of the second set was determined.

Because the determined length of the relevant history relates to one specific combination of the first type of data and of the second type of data, one may use the device or method to determine for different combinations to obtain different lengths of a relevant history. This is in particular advantageous if data of, for example, different sensors is available for predicting a characteristic of a physical entity. By using the device or the method for several combinations one may find for every sensor the optimal history length and thereby one may create an even more reduced set of sensor data for use in predictive or machine learning technologies without losing too much prediction accuracy.

Optionally, the determining of the length of the relevant history comprises i) obtaining a temporary reduced first set of data from the first set data of data, in the temporary reduced first set of data for each sequence an oldest instance of data has been removed compared to the sequences of the first set of data, ii) obtaining the second conditional entropy for the second set of data given the temporary reduced set, iii) comparing the second conditional entropy with the first conditional entropy for determining whether the second conditional entropy is within the maximum entropy increase threshold from the first conditional entropy, and a) if the second conditional entropy is within the maximum entropy increase threshold from the first conditional entropy, then remove from the sequences of the temporary reduced first set of data the oldest instances and the obtaining of the second conditional entropy and the comparing of the second conditional entropy with the first conditional entropy are performed once again, or b) if the second conditional entropy is not within the maximum entropy increase threshold from the first conditional entropy, then the determined length of the relevant history is the length of the sequences of the temporary reduced first set plus one.

This optional embodiment provides an effective embodiment for determining the length of the relevant history. According to the embodiment, a search is started for the length of the relevant history by starting the search with a relatively large reduced first set of data and subsequently reducing the size of the reduced first set in small steps and determining whether this set is still within the boundaries defined by the first conditional entropy and the maximum entropy increase threshold.

It is to be noted that embodiments of the determining of the length of the relevant history are not limited to the above discussed search algorithm. The determining of the length of the relevant history can also be based on a binary search algorithm: first a second conditional entropy is determined for a temporary reduced first set having sequences that have only the most recent half of the sequences of the first set and determining in which direction the length of the relevant history can be found. If it is known whether the length of the relevant history is in the most recent half or the older half of the history, a temporary reduced first set is obtained for a point in the middle of the most recent half or the older half of the history, respectively, and it is determined whether the length of the relevant history can be found before or after this points, etc. The determining of the length of the relevant history can also be based on other search algorithms that are appropriate for sorted lists: the values of the second conditional entropy increase or remain equal when the lengths of the sequences in the temporary reduced first set are reduced.

In an embodiment, the obtaining of the first conditional entropy comprises estimating the first conditional entropy by i) applying a Context Tree Weighting method to the second set and first set to obtain a first context tree, and ii) using a weighted probability of the root of the first context tree to calculate the estimation of first conditional entropy. Every unique sequence of the first set is represented by a path in the first context tree and counts stored in the nodes of the first context tree are based on the corresponding elements of the second set. The Context Tree Weighting method is a well-known method in the field of text compression. If, in the context of the invention, it is assumed that the data of the first set is generated by a tree source, the Context Tree Weighting method is an efficient and effective method to generate an estimated tree for this tree source—the estimated tree is the first context tree in the above discussed context. The Context Tree Weighting method provides efficient and effective means to calculate weighted probabilities for the nodes of the context tree, and, given the above assumption(s), an estimation of the first conditional entropy can be obtained from the weighted probability of root of the first context tree. Thus, the Context Tree Weighting method provides effective and efficient means to estimate the first conditional entropy.

In an embodiment, the obtaining of the second conditional entropy comprises estimating the second conditional entropy by i) applying the Context Tree Weighting method to the second set and the reduced first set or the temporary reduced first set to obtain a second context tree, and ii) using a weighted probability of the root of the second context tree to calculate the estimated second conditional entropy. Every unique sequence of the reduced first set or the temporary reduced first set is represented by a path in the second context tree and counts stored in the nodes of the second context tree are based on the corresponding elements of the second data set. In line with the discussion above, the Context Tree Weighting method is an efficient and effective method to obtain an estimation of the second conditional entropy.

In an embodiment, instead of completely applying the Context Tree Weighting method to the second set and the reduced first set or the temporary reduced first set, the second context tree is obtained by removing leafs from the first context tree that have, seen from the root, a depth that is larger than the length of the sequences of the reduced first set or the temporary reduced first set. As discussed previously, one may estimate the second conditional entropy by building a new second context tree. The inventors observed that the second context tree is a sub tree of the first context tree that was built for estimating the first conditional entropy. The inventors have found that, if from each sequences of the first set the oldest instance is removed, the depth of the second context tree is reduced by one, namely, the second context tree does not contain the leafs of the tree end edges ending in the leaf nodes. By deduction one may conclude that when the sequences of the reduced first set are of a given length, that then all leafs and nodes (plus corresponding edges) of the first context tree with a depth larger than this given length have to be removed for obtaining the second context tree. This embodiment enables an even more efficient estimation of the second conditional entropy.

In an embodiment, the instances of the first type of data are discrete values. Using such continuous data results in much more complex ways of calculating or estimating the first and/or second conditional entropy. The Context Tree Weighting method is most efficient with respect to memory use and computational power if the number of discrete values of the instances of the first type are limited. In an embodiment, the method of determining the length of the relevant history also comprises quantizing instances of continuous data to obtain the discrete values of the instances of the first type of data, wherein the quantizing is performed such that a loss of mutual information between the second type of data and the first type of data is within a maximum information loss threshold. Quantizing results in a loss of mutual information, but the increase in efficiency of the method outweighs the loss of mutual information if this loss is kept within an acceptable maximum information loss threshold. An embodiment of such a quantizing is creating a number of equally sized bins in between the minimum and maximum value of the continuous data of the first type of data and assigning a number of the bin to the continuous data that falls within the boundaries of that bin. By increasing the number of bins, the loss of mutual information may be reduced. More advanced method to reduce the loss of mutual information may be used as well.

According to another aspect, a method of reducing a dataset is provided. The method of reducing the dataset comprises the method of determining the length of the relevant history according to anyone of the above discussed embodiments of this method, and comprises reducing the first data set by deleting in every sequence of the first set of data oldest instances of the first type of data until the sequence has the determined length of the relevant history. Thereby one obtains a significantly reduced first data set that is still very useful in predicting instances of the second type of data if one has a (more recent) sequence of instances of the first type of data.

According to a further aspect, a method of predicting an instance of a second type of data based on a history of instances of the first type of data is provided. The method comprises the above discussed method of reducing a data set and comprises: i) receiving a recent history of instances of the first type of data, and ii) using the reduced first set of data and the second set of data to predict an instance of the second type of data of train a prediction model. With this method instances of the second type of data are predicted relatively accurate while the amount of historical data stored is significantly reduced. Thereby a more efficient way of predicting instances of the second type of data is obtained. The exact way of predicting instances of the second type is not relevant in the context of this document—in this embodiment it is only relevant that the method of predicting uses historical data in the form of instances of the first type of data and of instances of the second type of data.

According to an aspect of the invention, a computer program product for determining a length of a relevant history of instances of a first type of data is provided. The program is operative to cause a processor to perform any one of the above discussed methods.

Further preferred embodiments of the device and method according to the invention are given in the appended claims, disclosure of which is incorporated herein by reference.

BRIEF DESCRIPTION OF THE DRAWINGS

These and other aspects of the invention will be apparent from and elucidated further with reference to the embodiments described by way of example in the following description and with reference to the accompanying drawings, in which FIG. 1 schematically shows a device for determining a length of a relevant history of instances of a first type of data.

The figures are purely diagrammatic and not drawn to scale. In the Figures, elements which correspond to elements already described may have the same reference numerals.

DETAILED DESCRIPTION OF EMBODIMENTS

Figure 3:
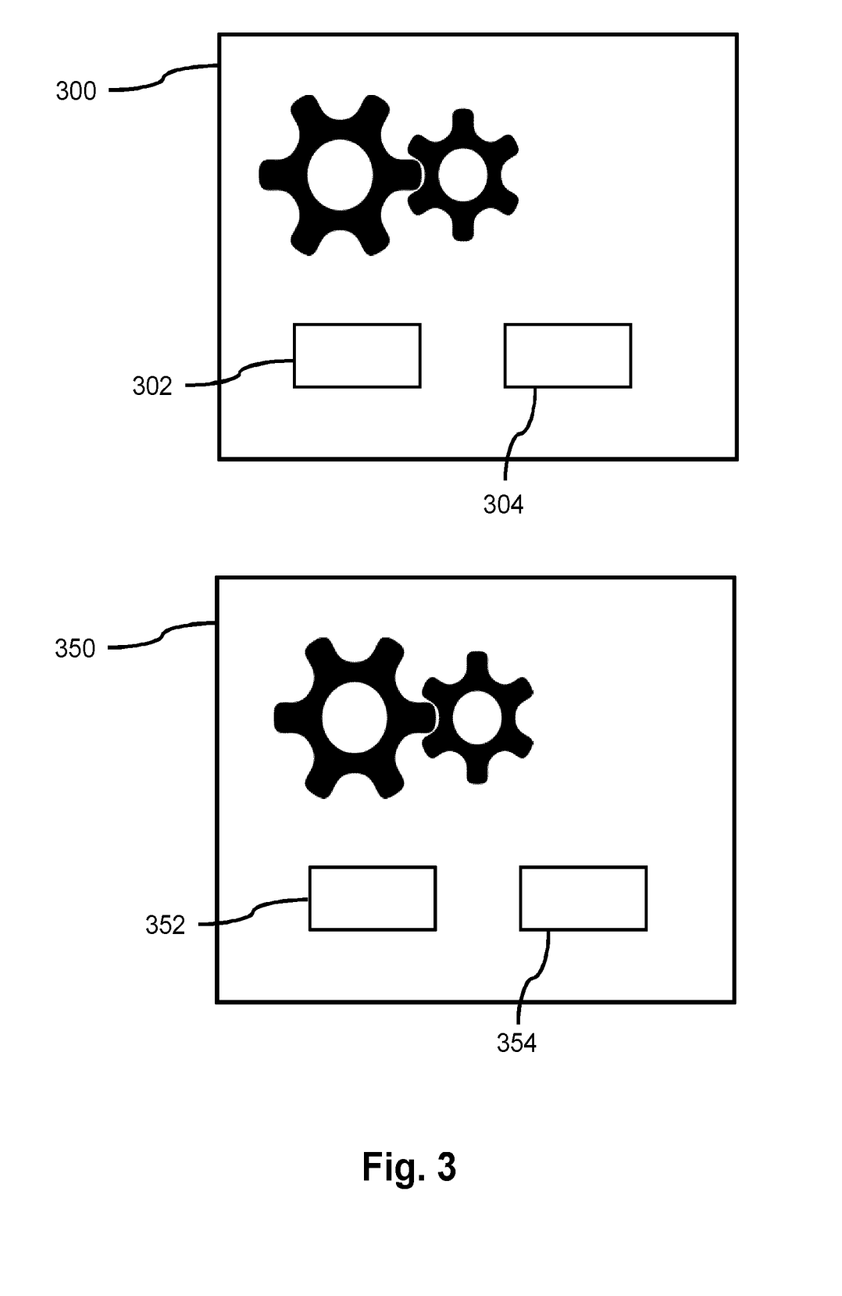

FIG. 3 schematically shows two machines 300, 350 of the same type that may generate instances of a first type of data and instances of a second type of data. FIG. 3 is an example of an area where the device and method for determining a length of a relevant history of instances of a first type of data can be applied. This figure is being used in the discussion of FIG. 1. It is to be noted that both machines 300, 350 are of the same type, which means that they are of the same design, perform the same function, etc. Both machines 300, 350 comprise sensors 302, 352 that generate instances of a first type of data. This means that sensors 302, 352 are similar to each other and have the same function in both machines 300, 350. For example, the sensor 302, 352 measure a temperature of a motor of the machine. Both machines 300, 350 both have a physical entity 304, 354 of which a characteristic is determined and/or has to be predicted. The characteristic is an instance of a second type of data. For example, the physical entity 304, 354 are a motor of the machine and the characteristic is "the motor 304 or 354 is operating or malfunctions".

Figure 1:
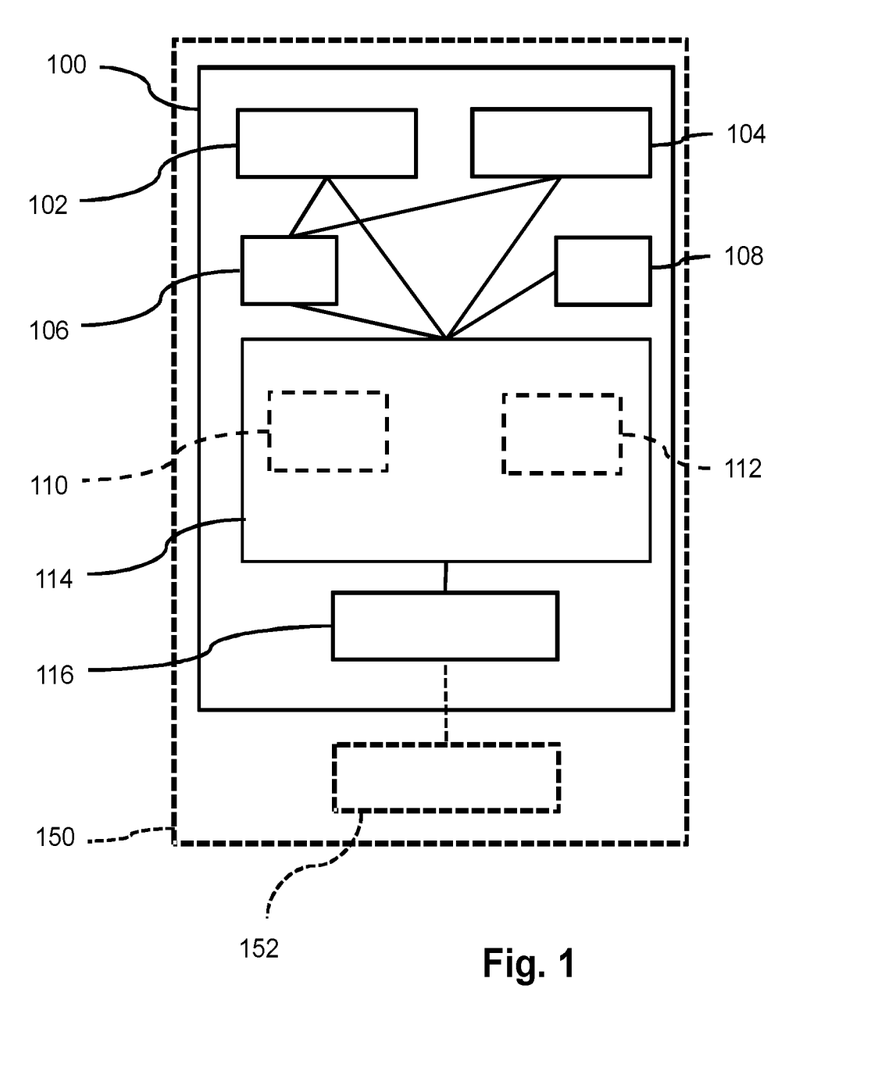

FIG. 1 schematically shows a device 100 for determining a length of a relevant history of instances of a first type of data. The instances of the first type of data comprise information that is useful and can be used to predict instance of the second type of data. The device comprising a first data set unit 102, a second data set unit 104, a first conditional entropy unit 106, a threshold unit 108, a length determining unit 114, and an output unit 116.

The second data set unit 104 is arranged for obtaining a second set of data that comprises instances of the second type of data. Instances of the second type of data comprise a characteristic of a physical entity. The second set is, for example, indicated by Y. The set Y comprises several instances $y_i$ that are a characteristic of the physical entity at different moments in time. For example, the instance $y_i$ are the characteristics "the motor 304 or 354 operates well or malfunctions". For example, a first element of the set is: $y_{1(machine\ 1,\ t=15)}=1$ if the motor of machine 1 operates well at the moment in time 15, a second element of the set is: $y_{2(machine\ 2,\ t=25)}=0$ if the motor of machine 2 malfunctions at the moment in time 25.

The first data set unit 102 is arranged for obtaining a first set of data that comprises sequences of instances of the first type of data. Each sequence provides a history of instances of the first type of data for a corresponding element of the second set. Each sequence comprises instances preceding, and optionally of, the moment in time at which the corresponding element of the second set is determined. The instances of the first type of data are ordered according to time in the sequences. Instances of the first type of data comprise measured sensor data. For example, the first set is indicated with X and comprises several sequences $x_1, x_2, \ldots$ Sequence $x_1$ relates to instance $y_i$ of the second set Y and, thus, comprises instances of data of sensor 302 of an interval of time that precedes (and optionally comprises) the moment in time at which the characteristic $y_1=1$ of the motor 304 is obtained. For example, sequence $x_1 = (xi_{(motor\ sensor\ 302,\ t=15)} xi_{(motor\ sensor\ 302,\ t=14)} xi_{(motor\ sensor\ 302,\ t=13)} xi_{(motor\ sensor\ 302,\ t=12)} \ldots)$, wherein xi refers to an instance of the first type of data. Sequence $x_2$ relates to instance $y_2$ of the second set Y and comprises instance of sensor 352 of an interval of time that precedes (and optionally comprises) the moment in time that the characteristic of motor 354 is obtained. For example, sequence $x_2=(xi_{(motor\ sensor\ 352,\ t=25)} xi_{(motor\ sensor\ 352,\ t=24)} xi_{(motor\ sensor\ 352,\ t=23)} xi_{(motor\ sensor\ 352,\ t=22)} \ldots)$. The sequences $x_1$ and $x_2$ comprise the same number of instances of the first type of data—thus, in other words, the intervals of time for which the sequences $x_1$ and $x_2$ comprise instances of the first type have the same length.

The first conditional entropy unit 106 is arranged for obtaining a first conditional entropy for the second set of data given the first set of data. In the example of the data of machines 300 and 350, the first conditional entropy is indicated by $H_1(Y|X)$. Conditional entropy is well defined in the field of information theory. Later in this document embodiments of calculating or estimating the first conditional entropy are provided. The first conditional entropy unit 106 may be coupled to the first data set unit 102 and the second data set unit 104 may be arranged for receiving the first set of data and the second set of data.

The threshold unit 108 is arranged for obtaining a maximum entropy increase threshold indicating a factor by which the first conditional entropy may increase when the length of the sequences in the first set of data is reduced. For example, in practical embodiments, the maximum entropy increase threshold is indicated by a and the value of a is a number in between zero and one. 1 means that the first conditional entropy may increase by 100%, 0.5 means that the first conditional entropy may increase by 50%, etc. Assume that the first set is reduced to $X_r$, than the maximum entropy increase threshold defines that $H(Y|X_r) \leq (1+\alpha)H_1(Y|X)$ (in which the lengths of sequences of reduced first set $X_r$ are shorter than the sequences of X).

The length determining unit 114 is arranged for determining the length of the relevant history by determining a smallest length for the sequences of a reduced first set of data for which a second conditional entropy for the second set of data given the reduced first set of data is within the maximum entropy increase threshold from the first conditional entropy. The reduced first set of data comprises sequences of the smallest length and the sequences of the reduced set of data comprises the most recent instances of the first type of data of their corresponding sequences in the first set of data. The length determining unit 114 may be coupled to the first data set unit 102, to the second data set unit 104, to the threshold unit 108, and to the first conditional entropy unit 106 for receiving the first set of data, the second set of data, the maximum entropy increase threshold and the first conditional entropy, respectively.

The threshold unit 108 does not determine to which length the sequences in the reduced first set $X_r$ may be reduced, but provides a value that is part of a condition for determining the length of the relevant history. The length determining unit 114 determines the minimum length of the sequences in the reduced first data set such that the condition $H_2(Y|X_r) \leq (1+\alpha)H_1(Y|X)$ is true. $H_2(Y|X_r)$ is the second conditional entropy for the second set given the reduced first data set. Thus, the length determining unit 114 performs a search to find this minimum length. Such a search may be executed in different ways. Embodiments are discussed later in the document. It is further to be noticed that a reduced sequence still comprises the most recent instances of the first type of data. For example, if the above discussed sequence $x_1$ is reduced to 3 elements only, then the reduced sequence is:

$x_{1r}=(xi_{(motor\ sensor\ 302,\ t=15)} xi_{(motor\ sensor\ 302,\ t=14)} xi_{(motor\ sensor\ 302,\ t=13)})$ The length determining unit 114 may comprise a reduction unit 110 that creates the reduced first set $X_r$ on the basis of the first set of data by removing a specific number of oldest instances from the sequences of the first set of data. The length determining unit 114 may comprise a second conditional entropy unit for calculating a second conditional entropy for the second set given the reduced first set of data: $H_2(Y|X_r)$.

The output unit 116 is arranged for providing the smallest length for the sequences as the length of the relevant history to, for example, a data reduction arrangement for reducing the amount of history stored for the data of the first type. The output unit is coupled to the length determining unit to receive the smallest length for the sequences. If this value is provided to, for example, a data reduction arrangement that has to reduce the size of the first set of data X, the oldest instances are removed from all sequences in X until the sequences have the length that is indicated by the value.

The first data set unit 102, the second data set unit 104 and the threshold unit 108 may comprise data storages in which the first set of data, the second set of data and the maximum entropy increase threshold are, respectively, stored. These units may also share a common memory in which this data may be stored. The first data set unit 102, the second data set unit 104 and the threshold unit 108 may in addition, or alternatively, comprise an input at which the first set of data, the second set of data and the maximum entropy increase threshold are, respectively, received. These units may also share a common input. Such an input may also comprises a user interface, such as a graphical user interface, at which a user can provide input for at least one of the first set of data, the second set of data or the maximum entropy increase threshold.

The first data set unit 102, the second data set unit 104 and the threshold unit 108 may all comprise dedicated hardware at which the first set of data, the second set of data and the maximum entropy increase threshold are, respectively, generated or they are implemented on a general purpose processor which runs a computer program comprising instructions that generate the first set of data, the second set of data and the maximum entropy increase threshold, respectively. The first conditional entropy unit 106 and the length determining unit 114 may comprise dedicated hardware which is configured to perform the task of the respective units. The first conditional entropy unit 106 and the length determining unit 114 may also comprise a general purpose processor which runs a computer program that comprises instructions for executing the tasks of the respective units. Also, in another embodiment, the device 100 for determining a length of a relevant history may comprise a computer that comprises a memory or a data storage, optional inputs, outputs and user interface and that comprises a general purpose processor that runs a computer program that comprises instructions to perform at least one of the tasks of one of the units of the device 100 for determining a length of a relevant history of instances of a first type of data.

FIG. 1 further shows a data reduction system 150. The data reduction system 150 comprises the device 100 for determining a length of a history of instances of a first type of data for reducing a data set comprising instances of the first type of data. The data reduction system 150 further comprises a data reduction unit 152 that obtains a reduced set of data based on the first set of data and the reduced set comprises sequences of instances of the first type of data. A length of the sequences in the reduced set is based on the determined length provided by the device for determining a length of a history of instances of a first type of data.

Figure 2:
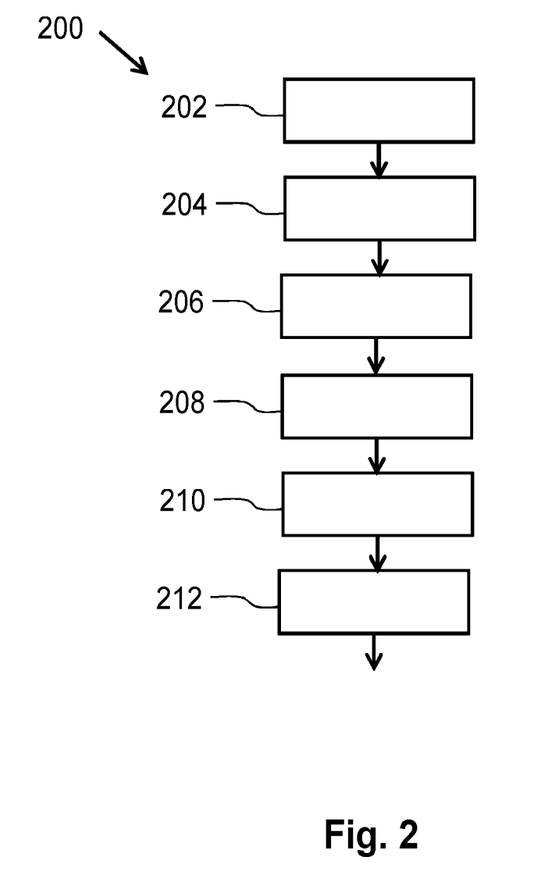
FIG. 2 schematically shows a method of determining a length of a relevant history of instances of a first type of data, FIG. 3 schematically shows two machines of the same type that may generate instances of a first type of data and instances of a second type of data, FIG. 4 schematically shows an embodiment of a computer program product.

FIG. 2 schematically shows a method 200 of determining a length of a relevant history of instances of a first type of data. The instances of the first type of data comprising information for predicting instance of a second type of data. The method 200 comprises obtaining 202 a second set of data comprising instances of the second type of data, instances of the second type of data comprising a characteristic of a physical entity, obtaining 204 a first set of data comprising sequences of instances of the first type of data, each sequence providing a history of instances of the first type of data for a corresponding element of the second set, each sequence comprising instances preceding and optionally of the moment in time at which the corresponding element of the second set is determined, the instances of the first type of data being ordered according to time in the sequences, instances of the first type of data comprising measured sensor data, obtaining 206 a first conditional entropy for the second set of data given the first set of data, obtaining 208 a maximum entropy increase threshold indicating a factor by which the first conditional entropy may increase when the length of the sequences in the first set of data is reduced, determining 210 the length of the relevant history by determining a smallest length for the sequences of a reduced first set of data for which a second conditional entropy for the second set of data given the reduced first set of data is within the maximum entropy increase threshold from the first conditional entropy, the reduced first set of data comprises sequences of the smallest length and the sequences of the reduced set of data comprise the most recent instances of the first type of data of their corresponding sequences in the first set of data, providing 212 the smallest length for the sequences as the length of the relevant history to, for example, a data reduction arrangement for reducing the amount of history stored for the first type of data.

Hereinafter the operation of the device for determining a length of a relevant history of instances of a first type of data and of the method of determining a length of a relevant history of instances of a first type of data is discussed more in detail by defining the first set of data as a matrix X and the second set of data as the vector Y. The sequences of the first set of data are rows $r_i$ in the matrix X and a first element $y_1$ of the vector Y is a corresponding instance of the second type of data that belongs to the first row $r_1$ of the matrix X. Furthermore, the first elements $x_{i1}$ of each row $r_i$ is the most recent instance of that sequence and each subsequent instance of the row is an older instance of the first type of data. Thus, the columns of the matrix represent time and columns with a higher number relate to older moments in time. Using a matrix for the first type of data, defining that the sequences are provided in the rows of the matrix X, defining that the first element of the rows are the most recent elements of the rows and representing the second set of data by the vector Y are just implementation details. Embodiments of the invention are not limited to these details. A practitioner in the art would directly understand that the columns of the matrix may also comprises the sequences and that the time order of the instances in the sequences may be different as well.

Thus, the first set of data is matrix $$X = \begin{bmatrix} r_1 \\ \vdots \\ r_m \end{bmatrix} = \begin{bmatrix} x_{11} & \cdots & x_{1n} \\ \vdots & \ddots & \vdots \\ x_{m1} & \cdots & x_{mn} \end{bmatrix},$$

wherein the rows $r_i$ comprise the sequences with instances of the first type of data, and $x_{ij}$ are instances of the first type of data. The matrix X comprises m sequences with instances of the first type of data, and, thus, the matrix has m rows. Each sequence has a length n and, thus, the matrix comprises n columns. It is to be noted that the number of columns n is a system variable that may depend on the amount of historical data available and the processing capabilities of the device 100 or method 200. It is to be noted that the number over rows m is also a system variable that may depend on the amount of historical data available and the processing capabilities of the devices 100 or method 200. If one has a given set of historical data, an increase in n results in a reduction of m, and vice versa.

Thus, the second set of data is $$Y = \begin{bmatrix} y_1 \\ \vdots \\ y_m \end{bmatrix},$$

wherein $y_i$ is an instance of the second type of data that relates to the sequence of row $r_i$.

In an embodiment, there is a first test machine, such as, for example, machine 300 of FIG. 3. At regular moments in time data is collected from the sensor 302 and from the physical entity 304. If we assume that the sensor 302 collects temperature data from the physical entity 304 that is a motor, and that the operational status of the motor is collected at regular moment in time, for example, 1000 times, we end up with two sequences with instances of data:

Temperature sequence=$(T_{t=1}, T_{t=2}, T_{t=3}, \ldots T_{t=1000})$

Motor sequence=$(M_{t=1}, M_{t=2}, M_{t=3}, \ldots M_{t=1000})$

And if we assume that the maximum lengths of the rows in the matrix X is 100, we can generate the above discussed matrix X and vector Y from these sequences by:

$$X = \begin{bmatrix} T_{t=100} & \cdots & T_{t=1} \\ \vdots & \ddots & \vdots \\ T_{t=999} & \cdots & T_{t=900} \end{bmatrix}$$

and $$Y = \begin{bmatrix} M_{t=101} \\ \vdots \\ M_{t=1000} \end{bmatrix}$$

Thus, each row $r_i$ of matrix X comprises a history of the sensor 302 of an interval of time that immediately precedes the moment of time that the characteristic of the motor is determined. Note that, if the length of the sequences (rows $r_i$) is increased, the number of rows in matrix X and the number of elements in Y decreases.

In another embodiment, there are two test machines at which instance of the first data type and instances of the second data type were collected. For example, the machines 300 and 350 of FIG. 3 are used to collect the data and the data of the sensors 302, 352 are collected and the data of the motors 304, 354 are collected. If it is assumed that the data is collected at regular moments in time, for example, at both machines 500 consecutive moments in time, we end up with four sequences with instances of data:

Machine 1:

Temperature sequence machine 1=$(T1_{t=1}, T1_{t=2}, T1_{t=3}, \ldots, T1_{t=500})$ Motor sequence machine 1=$(M1_{t=1}, M1_{t=2}, M1_{t=3}, \ldots, M1_{t=500})$ Machine 2:

Temperature sequence machine 2=$(T2_{t=1}, T2_{t=2}, T2_{t=3}, \ldots, T2_{t=500})$ Motor sequence machine 2=$(M2_{t=1}, M2_{t=2}, M2_{t=3}, \ldots, M2_{t=500})$ And if we assume that the lengths of the rows in the matrix X is 200, we can generate the above discussed matrix X and vector Y from these sequences by:

$$X = \begin{bmatrix} T1_{t=200} & \cdots & T1_{t=1} \\ \vdots & & \vdots \\ T1_{t=499} & \cdots & T1_{t=300} \\ T2_{t=200} & \cdots & T2_{t=1} \\ \vdots & & \vdots \\ T2_{t=499} & \cdots & T2_{t=300} \end{bmatrix}$$

and $$Y = \begin{bmatrix} M1_{t=201} \\ \vdots \\ M1_{t=500} \\ M2_{t=201} \\ \vdots \\ M2_{t=500} \end{bmatrix}$$

Please note that the above discussed embodiments of obtaining the matrices X and Y from the data obtained from one or more machines are just examples. Data from more machines of the same type may be used. Data from different moments in time (e.g. of different days, weeks or months) may be used, etc.

In an embodiment, the instances of data of the first type are discrete values and, in an embodiment, the values of the instances of data of the first type can only be chosen from a small set of possible values. If a sensor generates more values, the sensor data may be quantized, i.e., put in bins and each bin is represented by a discrete value. To prevent too much loss of information, in an advantageous embodiment, the data is quantized such that the mutual information between the non-quantized data with respect to Y and the mutual information between the quantized data with respect to Y does not differ much from each other. Thus, I(X, $Y_{non-reduced}$)≈(X, $Y_{reduced}$). For example, Cardinal ("Quantization with an Information-Theoretic Distortion Measure") describes a method using a Loyd quantizer to quantize data such that the mutual information between X and Y does not much reduce as the result of the quantizing. The document "Quantization with an Information-Theoretic Distortion Measure", Jean Cardinal, Oct. 23, 2002, published by the "Université Libre de Bruxelles" on the website http://www.ulb.ac.be/do/publications/RT_2002.html, and also published on the website http://citeseerx.ist.psu.edu/viewdoc/summary?doi=10.1.1.20.3058, is included by reference.

In order to determine which portion of the rows $r_i$ can be defined as "not relevant", in other words, in order to determine columns are not relevant, initially a first conditional entropy $H_1(Y|X)$ is determined. If the probabilities of the individual instances p(x), p(y) are known and if the mutual probabilities of combinations of instances p(x,y) are known, the conditional entropy can be calculated by $$H(Y \mid X) = \sum_{x \in X, y \in Y} p(x, y) \log \frac{p(x)}{p(x, y)}.$$

One may obtain the probabilities of the individual instances p(x), p(y) and the mutual probabilities of combinations of instances p(x,y) by estimating these probabilities on the basis of the available data: one may count, for example, how many times a first value is present in the matrix X and estimate the probability of this first value by dividing the count by the number of element in the matrix X.

The first conditional entropy $H_1(Y|X)$ can also be estimated by building a first context tree with the so-termed Context Tree Weighting method and use the weighted probability of the root of the first context tree to calculate an estimation of the first conditional entropy. The Context Tree Weighting method is well known in the art of information theory and (text-) compression and has, for example, been described by Willems et al in papers i) "The Context-Tree Weighting Method: Basic Properties", Willems et al, IEEE Transactions on Information Theory, Vol 42, No 3, pp 653-664; ii) "Reflections on 'The Context-Tree Weighting Method: Basic Properties'" Willems et al., *Newsletter of the IEEE Information Theory Society,* 1997; and iii) "1996 IT society Paper Award, Reflection on the Prize Paper: 'The Context-Tree Weighting Method: Basic Properties'", Willems et al, IEEE Information Theory Society Newsletter, Vol. 47, No 1, March 1997, pp 19-27. The above mentioned papers i), ii) and iii) are hereby included by reference.

The Context-Tree Weighting Method is applied in such a way that unique rows $r_i$ in the matrix X form paths in the first context tree and the counts register in the nodes of the first context tree correspond to the number of occurrences of the corresponding elements $y_i$ of Y Initially the Context-Tree Weighting Method has been described for binary data and how this may be extended towards text-data. Today the practitioner in the art has several implementations at his disposal for other forms of non-binary data. Thus, if the discrete data in X or Y has more than two different possible values, one of such implantations must be used to build the first context tree. For example, the article "Context Tree Weighting: Multi-alphabet Sources" of Tjalkens et al, Proceedings Fourteenth Symposium on Information Theory in the Benelux, Veldhoven, The Nether-lands, May 17-18, 1993, pp. 128-135 describes how the Context-Tree Weighing method may be applied to non-binary data. The document "Context Tree Weighting: Multi-alphabet Sources" is herewith included by reference.

The Context-Tree Weighting Method provides means to calculate for every node a weighted probability $P_w$. It has been proven that the first conditional entropy may be estimated on the basis of the weighted probability $P_w$ by formula $$H_1(Y \mid X) \approx -\frac{1}{N} \log_2 P_{w, root\ context\ tree\ 1},$$

wherein N is the number of elements of vector Y.

In the Context-Tree Weighting Method for each node an estimated probability $P_e$ is calculated for each node on the basis of the counts stored in each node. In the Context-Tree Weighting Method the weighted probability P of a leaf node is equal to the estimated probability $P_e$ of that leaf node. For a specific node that is connected to one or more nodes at a deeper level in the context tree, the weighted probability P is determined by a formula that depends on the estimated probability $P_e$ of that specific node and the weighted probabilities P of the one-level-deeper-nodes to which it is connected. These calculations are well described in the previously introduced documents i) "The Context-Tree Weighting Method: Basic Properties", Willems et al, IEEE Transactions on Information Theory, Vol 42, No 3, pp 653-664; ii) "Reflections on 'The Context-Tree Weighting Method: Basic Properties'" Willems et al., *Newsletter of the IEEE Information Theory Society,* 1997; and iii) "1996 IT society Paper Award, Reflection on the Prize Paper: 'The Context-Tree Weighting Method: Basic Properties'", Willems et al, IEEE Information Theory Society Newsletter, Vol. 47, No 1, March 1997, pp 19-27.

A maximum entropy increase threshold a defines how much the first conditional entropy $H_1(Y|X)$ may increase if the amount of data in the matrix X is reduced, and more in particular, if for every row $r_i$ one or more oldest instance $x_{ij}$ of the first type of data are removed. This maximum entropy increase threshold a defines that the optimal length of the rows $r_i$ of a reduced matrix $X_r$ is the minimum length at which the condition $H_2(Y|X_r) \Leftarrow (1+\alpha)H_1(Y|X)$ is fulfilled. Wherein $X_r$ is a submatrix of matrix X comprising the same number of rows as matrix X and each row of matrix $X_r$ has a reduced length and is equal to a front portion of its corresponding row of matrix X. In other words, reduced matrix $X_r$ has only a first number of columns of matrix X, and more specifically, the number of columns is equal to the minimum length.

A search algorithms is provided for finding the minimum length. This algorithm is based on the chain rule from information theory, which is, when being translated to the specific problem of this document:

$$H(Y|X_{n\ columns})H(Y|X_{r,n-1\ columns}) \leq H(Y|X_{r,n-2\ columns}) \leq \ldots \leq H(Y|X_{r,one\ column})$$

Thus, one may start with generating a reduced matrix $X_{r,n-1 columns}$ to determine a second conditional entropy for $H_2(Y|X_{r,n-1\ columns})$ and check whether $H_2 \Leftarrow (1+\alpha)H_1$ is still fulfilled. If yes, the reduced matrix is further reduced by deleting the last column with the oldest instances of each sequence towards $X_{r,n-2\ columns}$ and a new second conditional entropy is determined for $H_2(Y|X_{r,n-2\ columns})$ and one checks whether the condition $H_2\ (1+\alpha)H_1$. If yes, the size of the reduced matrix is further reduced by deleting the last column and determining the second conditional entropy. As soon as the condition $H_2 \Leftarrow (1+\alpha)H_1$ is not anymore fulfilled, one knows that not the last reduced matrix, but the previously reduced matrix $X_{r,i\ columns}$ comprises the optimal relevant history of the first type of data and the number of columns i of the previously reduced matrix $X_{r,i\ columns}$ is the length of the relevant history of instances of the first type of data. In other words, the length of the relevant history is the number of columns of the last reduced matrix $X_r$ plus one.

In this algorithm a sort of linear forward search is executed: start with the smallest conditional entropy and search into the direction of larger conditional entropies to find the point where the condition is not anymore fulfilled. It is to be noted that other search algorithms for ordered lists of data may also be applied. An example of such another search algorithm is a binary search.

In the above described search algorithm, the size of the matrix X is reduced in each subsequent step and a second conditional entropy $H_2(Y|X_r)$ is determined. The determining of the second conditional entropy may also be based on, similar as discussed above, the Context-Tree Weighting Method to obtain a second context tree and use the weighted probability $P_w$ of the root of the second context tree to estimate the second conditional entropy $$H_2(Y|X_r) \approx -\frac{1}{N}\log_2 P_{w,root\ context\ tree\ 2}.$$

The context trees build by the Context-Tree Weighting method have specific characteristics: the most recent instances of each row of matrix X (or the reduce matrix $X_r$) are represented by edges from the root to the nodes at the first depth level. The second most recent instances of each row of X are represented by edges from the nodes at the first depth level to the second depth level, etc. The edges from the leaf node to the nodes that precede the leaf nodes represent the oldest instances of each row of X. Therefore, instead of reducing the size of the matrix and rebuilding the second context tree in every step, the second context tree may be derived from its predecessor (and the first obtained second context tree may be derived from the first context tree). This is done as follows: In a first search step, if the second context tree has to be obtained for the first time, the second context tree is a copy of the first context tree in which the leaf nodes and edges ending in the leaf nodes are removed and in which the weighted probabilities $P_w$ of the nodes are updated according to the new situation. The Context-Tree Weighting Method describes how to calculate the weighted probabilities $P_w$ of the nodes based on the counts stored in the nodes. In a subsequent search step, the size of the second context tree is reduced by removing the leaf nodes and edges ending in the leaf nodes and updating the weighted probabilities $P_w$ of the nodes.

The updating of the weighted probabilities of the (reduced) second context tree can be performed as follows: As discussed previously, according to the Context-Tree Weighting method, one can calculate for every node in the second context tree an estimated probability $P_e$ which only depends on the counts stored in the respective node. The counts in the nodes do not change when the depth of the second context tree is reduced and, thus, the estimated probability $P_e$ do also not change when the leaf nodes and their corresponding edges are removed. The weighted probability $P_w$ is a function of the estimated probability $P_e$ of the node and of the weighted probabilities $P_w$ of the nodes at a larger depth to which it is connected. Thus, when the leaf nodes and their corresponding edges are removed from the second context tree, one only has to re-calculate the weighted probabilities $P_w$ by starting to calculate the weighted probabilities $P_w$ of the leaf nodes and moving towards the root of the second context tree.

Figure 4:
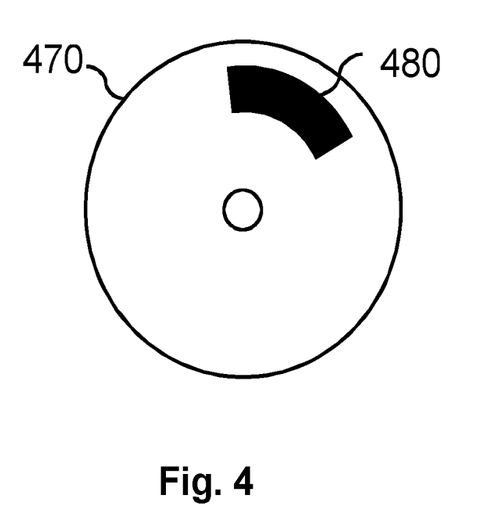

FIG. 4 schematically shows an embodiment of a computer program product 470. Embodiments also extends to computer program products 470, particularly computer programs on or in a carrier 470, adapted for putting the invention into practice. The computer program product may comprises a computer program 480. The program may be in the form of source code, object code, a code intermediate source and object code such as partially compiled form, or in any other form suitable for use in the implementation of the one of the above discussed methods. It will also be appreciated that such a program may have many different architectural designs. For example, a program code implementing the functionality of the method or device may be subdivided into one or more subroutines. Many different ways to distribute the functionality among these subroutines will be apparent to the skilled person. The subroutines may be stored together in one executable file to form a self-contained program. Such an executable file may comprise computer executable instructions, for example processor instructions and/or interpreter instructions (e.g. Java interpreter instructions). Alternatively, one or more or all of the subroutines may be stored in at least one external library file and linked with a main program either statically or dynamically, e.g. at run-time. The main program contains at least one call to at least one of the subroutines. Also, the subroutines may comprise function calls to each other. An embodiment relating to a computer program product 470 comprises computer executable instructions 480 corresponding to each of the processing steps of at least one of the methods set forth. These instructions may be subdivided into subroutines and/or be stored in one or more files that may be linked statically or dynamically. Another embodiment relating to a computer program product 470 comprises computer executable instructions 480 corresponding to each of the means of at least one of the systems and/or products set forth. These instructions may be subdivided into subroutines and/or be stored in one or more files that may be linked statically or dynamically.

The carrier of a computer program may be any entity or device capable of carrying the program. For example, the carrier may include a storage medium, such as a ROM, for example a CD ROM or a semiconductor ROM, or a magnetic recording medium, for example a floppy disc or hard disk. Further the carrier may be a transmissible carrier such as an electrical or optical signal, which may be conveyed via electrical or optical cable or by radio or other means. When the program is embodied in such a signal, the carrier may be constituted by such cable or other device or means. Alternatively, the carrier may be an integrated circuit in which the program is embedded, the integrated circuit being adapted for performing, or for use in the performance of, the relevant method.

The computer program 480 may be a computer program for a distributed processor system and may comprise computer code which causes a first processor system to perform a subset of the steps of the above discussed method and which causes a second processor system to perform another subset of the steps of the above discussed method. The subset of steps and the another subset of steps may be mutually exclusive.

In summary, this document provides a device for and a method of determining a length of a history of instances of a first type of data. The device comprises a second data set unit, a first data set unit, a first conditional entropy unit, a threshold unit, a length determining unit. The first data set unit, the second data set unit and the threshold unit obtain input data. The first conditional entropy unit determine a first conditional entropy for a second data set given a first data set. The determining unit searches for a length of the relevant history by determining a smallest length for sequences of a reduced first set of data for which a second conditional entropy for the second set of data given the reduced first set of data is within a maximum entropy increase threshold from the first conditional entropy.

It is to be noted that the invention may be implemented in hardware and/or software, using programmable components. A method for implementing the invention has the steps corresponding to the functions defined for the system as described with reference to FIG. 1.

It will be appreciated that the above description for clarity has described embodiments of the invention with reference to different functional units and processors. However, it will be apparent that any suitable distribution of functionality between different functional units or processors may be used without deviating from the invention. For example, functionality illustrated to be performed by separate units, processors or controllers may be performed by the same processor or controllers. Hence, references to specific functional units are only to be seen as references to suitable means for providing the described functionality rather than indicative of a strict logical or physical structure or organization. The invention can be implemented in any suitable form including hardware, software, firmware or any combination of these.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' or 'units' may be represented by the same item of hardware or software, and a processor may fulfill the function of one or more units, possibly in cooperation with hardware elements. Further, the invention is not limited to the embodiments, and the invention lies in each and every novel feature or combination of features described above or recited in mutually different dependent claims.

The invention claimed is:

1. A device including a processor for determining a length of a history of instances of a first type of data for reducing a data set comprising instances of the first type of data, the instances of the first type of data comprising information for predicting at least one instance of a second type of data, the device comprising:

a second data set unit for obtaining a second set of data comprising instances of the second type of data, instances of the second type of data comprising data being based on a characteristic of a physical entity;

a first data set unit for obtaining a first set of data comprising sequences of instances of the first type of data, each sequence providing a history of instances of the first type of data for a corresponding element of the second set, each sequence comprising instances preceding the moment in time at which the corresponding element of the second set is determined, the instances of the first type of data being ordered according to time in the sequences, instances of the first type of data comprising data being based on measured sensor;

a first conditional entropy unit for obtaining a first conditional entropy for the second set of data given the first set of data;

a threshold unit for obtaining a maximum entropy increase threshold indicating a factor by which the first conditional entropy may increase when the length of the sequences in the first set of data is reduced;

a length determining unit for determining the length of the relevant history by determining a smallest length for the sequences of a reduced first set of data for which a second conditional entropy for the second set of data given the reduced first set of data is within the maximum entropy increase threshold from the first conditional entropy, the reduced first set of data comprising sequences of the smallest length and the sequences of the reduced set of data comprising the most recent instances of the first type of data of their corresponding sequences in the first set of data; and an output unit for providing the smallest length for the sequences as the length of the relevant history for reducing the amount of history stored for the data of the first type.

2. A data reduction system including a processor, comprising:

a device for determining a length of a history of instances of a first type of data for reducing a data set comprising instances of the first type of data, the instances of the first type of data comprising information for predicting at least one instance of a second type of data, the device comprising:

a second data set unit for obtaining a second set of data comprising instances of the second type of data, instances of the second type of data comprising data being based on a characteristic of a physical entity;

a first data set unit for obtaining a first set of data comprising sequences of instances of the first type of data, each sequence providing a history of instances of the first type of data for a corresponding element of the second set, each sequence comprising instances preceding the moment in time at which the corresponding element of the second set is determined, the instances of the first type of data being ordered according to time in the sequences, instances of the first type of data comprising data being based on measured sensor;

a first conditional entropy unit for obtaining a first conditional entropy for the second set of data given the first set of data;

a threshold unit for obtaining a maximum entropy increase threshold indicating a factor by which the first conditional entropy may increase when the length of the sequences in the first set of data is reduced;

a length determining unit for determining the length of the relevant history by determining a smallest length for the sequences of a reduced first set of data for which a second conditional entropy for the second set of data given the reduced first set of data is within the maximum entropy increase threshold from the first conditional entropy, the reduced first set of data comprising sequences of the smallest length and the sequences of the reduced set of data comprising the most recent instances of the first type of data of their corresponding sequences in the first set of data; and an output unit for providing the smallest length for the sequences as the length of the relevant history for reducing the amount of history stored for the data of the first type; and a data reduction unit for obtaining a reduced set of data being based on the first set of data and comprising sequences of instances of the first type of data, wherein a length of the sequences of the reduced set is based on the determined length provided by the device for determining a length of a history of instances of a first type of data.

3. A computer-implemented method of determining a length of a history of instances of a first type of data for reducing a data set comprising instances of the first type of data, the instances of the first type of data comprising information for predicting instances of a second type of data, the method comprising:

obtaining a second set of data comprising instances of the second type of data, instances of the second type of data comprising data being based on a characteristic of a physical entity;

obtaining a first set of data comprising sequences of instances of the first type of data, each sequence providing a history of instances of the first type of data for a corresponding element of the second set, each sequence comprising instances preceding the moment in time at which the corresponding element of the second set is determined, the instances of the first type of data being ordered according to time in the sequences, instances of the first type of data comprising data being based on measured sensor;

obtaining a first conditional entropy for the second set of data given the first set of data;

obtaining a maximum entropy increase threshold indicating a factor by which the first conditional entropy may increase when the length of the sequences in the first set of data is reduced;

determining the length of the relevant history by determining a smallest length for the sequences of a reduced first set of data for which a second conditional entropy for the second set of data given the reduced first set of data is within the maximum entropy increase threshold from the first conditional entropy, the reduced first set of data comprising sequences of the smallest length and the sequences of the reduced set of data comprising the most recent instances of the first type of data of their corresponding sequences in the first set of data; and providing the smallest length for the sequences as the length of the relevant history for reducing the amount of history stored for the first type of data.

4. The method according to claim 3, wherein the determining of the length of the relevant history comprises:

obtaining a temporary reduced first set of data from the first set data of data, in the temporary reduced first set for each sequence an oldest instance has been removed compared to the sequences of the first set of data;

obtaining the second conditional entropy for the second set of data given the temporary reduced first set;

comparing the second conditional entropy with the first conditional entropy for determining whether the second conditional entropy is within the maximum entropy increase threshold from the first conditional entropy; and if the second conditional entropy is within the maximum entropy increase threshold from the first conditional entropy, then remove from the sequences of the temporary reduced first set of data the oldest instances and the obtaining of the second conditional entropy and the comparing of the second conditional entropy with the first conditional entropy are performed once again; or if the second conditional entropy is not within the maximum entropy increase threshold from the first conditional entropy, then the determined length of the relevant history is the length of the sequences of the temporary reduced first set of data plus one.

5. The method according to claim 3, wherein the obtaining of the first conditional entropy comprises estimating the first conditional entropy by applying a Context Tree Weighting method to the second set and first set to obtain a first context tree; and using a weighted probability of the root of the first context tree to calculate an estimation of first conditional entropy, wherein in the Context Tree Weighting method every unique sequence of the first set is represented by a path in the first context tree and counts stored in the nodes of the first context tree are based on the corresponding elements of the second set.

6. The method according to claim 3, wherein the obtaining of the second conditional entropy comprises estimating the second conditional entropy by applying the Context Tree Weighting method to the second set and the reduced first set or the temporary reduced first set to obtain a second context tree; and using a weighted probability of the root of the second context tree to calculate the estimated second conditional entropy, wherein in the Context Tree Weighting method every unique sequence of the reduced first set or the temporary reduced first set is represented by a path in the second context tree and counts stored in the nodes of the second context tree are based on the corresponding elements of the second data set.

7. The method according to claim 5, wherein instead of completely applying the Context Tree Weighting method to the second set and the reduced first set or the temporary reduced first set, the second context tree is obtained by removing leafs and nodes from the first context tree that have, seen from the root, a depth that is larger than the length of the sequences of the reduced first set or the temporary reduced first set.

8. The method according to claim 3, wherein the instances of the first type of data are discrete values.

9. The method according to claim 8, further comprising quantizing instances of continuous data to obtain the discrete values of the instances of the first type of data, wherein the quantizing is performed such that a loss of mutual information between the second type of data and the first type of data is within a maximum information loss threshold.

10. The method according to claim 3, further comprising reducing the first data set by deleting in every sequence of the first set of data oldest instances of the first type of data until the sequence has the determined length of the relevant history.

11. The method according to claim 10, further comprising receiving a recent history of instances of the first type of data; and using the reduced first set of data and the second set of data to predict an instance of the second type of data or to train a prediction model.

12. A non-transitory computer-readable medium having one or more executable instructions stored thereon, which when executed by a processor, cause the processor to perform a method for determining a length of a history of instances of a first type of data for reducing a data set comprising instances of the first type of data, the instances of the first type of data comprising information for predicting instances of a second type of data, the method comprising:

obtaining a second set of data comprising instances of the second type of data, instances of the second type of data comprising data being based on a characteristic of a physical entity;

obtaining a first set of data comprising sequences of instances of the first type of data, each sequence providing a history of instances of the first type of data for a corresponding element of the second set, each sequence comprising instances preceding the moment in time at which the corresponding element of the second set is determined, the instances of the first type of data being ordered according to time in the sequences, instances of the first type of data comprising data being based on measured sensor;

obtaining a first conditional entropy for the second set of data given the first set of data;

obtaining a maximum entropy increase threshold indicating a factor by which the first conditional entropy may increase when the length of the sequences in the first set of data is reduced;

determining the length of the relevant history by determining a smallest length for the sequences of a reduced first set of data for which a second conditional entropy for the second set of data given the reduced first set of data is within the maximum entropy increase threshold from the first conditional entropy, the reduced first set of data comprising sequences of the smallest length and the sequences of the reduced set of data comprising the most recent instances of the first type of data of their corresponding sequences in the first set of data; and providing the smallest length for the sequences as the length of the relevant history for reducing the amount of history stored for the first type of data.

\* \* \* \* \*